(12) United States Patent
Yamamoto

(10) Patent No.: US 7,986,077 B2
(45) Date of Patent: Jul. 26, 2011

(54) TUNING FORK TYPE QUARTZ PIECE AND OSCILLATOR COMPRISING SUCH TUNING FORK TYPE QUARTZ PIECE

(75) Inventor: Izumi Yamamoto, Sayama (JP)

(73) Assignee: Citizen Holdings Co., Ltd., Tokyo (JP)

( * ) Notice: Subject to any disclaimer, the term of this patent is extended or adjusted under 35 U.S.C. 154(b) by 653 days.

(21) Appl. No.: 10/588,794

(22) PCT Filed: Feb. 10, 2005

(86) PCT No.: PCT/JP2005/002040
§ 371 (c)(1),
(2), (4) Date: Nov. 10, 2008

(87) PCT Pub. No.: WO2005/076471
PCT Pub. Date: Aug. 18, 2005

(65) Prior Publication Data
US 2009/0066194 A1  Mar. 12, 2009

(30) Foreign Application Priority Data
Feb. 10, 2004  (JP) .................................. 2004-032789

(51) Int. Cl.
*H01L 41/04* (2006.01)
*H03H 9/215* (2006.01)

(52) U.S. Cl. ...................................... 310/370
(58) Field of Classification Search .............. 310/370
See application file for complete search history.

(56) References Cited

U.S. PATENT DOCUMENTS

| | | | |
|---|---|---|---|
| 6,587,009 B2 | 7/2003 | Kitamura et al. | |
| 7,067,966 B2 * | 6/2006 | Tanaya | 310/367 |
| 7,112,915 B2 * | 9/2006 | Tanaya et al. | 310/370 |
| 7,368,861 B2 * | 5/2008 | Tanaya | 310/370 |
| 7,397,172 B2 * | 7/2008 | Kikushima | 310/370 |
| 7,412,886 B2 * | 8/2008 | Dalla Piazza et al. | 73/504.16 |
| 7,518,291 B2 * | 4/2009 | Tanaya | 310/348 |
| 7,714,484 B2 * | 5/2010 | Hara et al. | 310/348 |
| 7,759,848 B2 * | 7/2010 | Hirasawa | 310/370 |
| 7,764,145 B2 * | 7/2010 | Iwai | 333/200 |
| 7,768,179 B2 * | 8/2010 | Kawashima | 310/370 |
| 2009/0015106 A1 * | 1/2009 | Tanaya | 310/344 |
| 2009/0189491 A1 * | 7/2009 | Kobayashi | 310/365 |
| 2009/0289530 A1 * | 11/2009 | Kawanishi | 310/370 |
| 2010/0079036 A1 * | 4/2010 | Iwai | 310/348 |

(Continued)

FOREIGN PATENT DOCUMENTS

JP         55-109925         8/1980

(Continued)

Primary Examiner — J. SanMartin
(74) Attorney, Agent, or Firm — Smith Gambrell & Russell LLP

(57) ABSTRACT

Grooves (2a, 3a) are formed in the tines (2, 3) of an oscillator, side surface electrodes (2e, 3e) are formed on the side surfaces of the tines, and groove electrodes (2d, 3d) are formed in the grooves, respectively. The width of the tines (2, 3) is fixed through the whole length of the tines, while, in a part close to the lower end of the tine, the width of the grooves (2a, 3a) is gradually reduced toward the lower end, whereby a trapezoid region (D) is formed between the side surface of the tine and the groove in this part, and a part of the region (D) is used as an arrangement region of an electrode (5c) which connects the groove electrode and the side surface electrode.

10 Claims, 12 Drawing Sheets

U.S. PATENT DOCUMENTS

| | | | |
|---|---|---|---|
| 2010/0096955 A1* | 4/2010 | Yamada | 310/370 |
| 2010/0156237 A1* | 6/2010 | Ichikawa et al. | 310/312 |
| 2010/0164332 A1* | 7/2010 | Kawanishi | 310/370 |
| 2010/0201229 A1* | 8/2010 | Saito | 310/370 |

FOREIGN PATENT DOCUMENTS

| | | |
|---|---|---|
| JP | 55-163482 | 12/1980 |
| JP | 56-034216 | 4/1981 |
| JP | 2002-76827 | 3/2002 |
| JP | 2002-261575 | 9/2002 |
| JP | 2003-87090 | 3/2003 |
| JP | 2003-133895 | 5/2003 |
| JP | 2004120556 A * | 4/2004 |
| JP | 2004350015 A * | 12/2004 |
| JP | 2005354649 A * | 12/2005 |
| JP | 2008131527 A * | 6/2008 |
| JP | 2008178021 A * | 7/2008 |
| JP | 2009027711 A * | 2/2009 |

* cited by examiner (a)

(b)

(c)

(a)

(b)

(a)

(b)

(a)

(b)

(c)

TUNING FORK TYPE QUARTZ PIECE AND OSCILLATOR COMPRISING SUCH TUNING FORK TYPE QUARTZ PIECE

TECHNICAL FIELD

The present invention relates to an oscillator comprising a tuning fork type oscillating piece made of quartz, and the like.

BACKGROUND ART

In recent years, as an oscillator used for a time reference of an electronic apparatus and the like, an oscillator having a small size and a small CI (crystal impedance) value has been required in accordance with miniaturization of the electronic apparatus in which the oscillator is used. For example, in the case of a tuning fork type crystal oscillator, as an oscillator responding to this requirement, there is conventionally known an oscillator, such as shown in FIG. 7A and FIG. 7B (for example, see Japanese Patent Application Laid-Open No. 2002-76827).

As shown in FIG. 7A, a tuning fork type crystal oscillator 110 has tines 112 and 113, and grooves 112a and 113a are formed on the front and rear surfaces of the tines 112 and 113 along the lengthwise direction of the tines. As a result, as shown in FIG. 7B, the tines 112 and 113 have an H shaped cross section, respectively. Here, such a tuning fork type crystal oscillator having an H shaped cross section has a characteristic that even when the size of the oscillator is reduced as compared with before, the electromechanical conversion coefficient can be increased and thereby the CI value or an equivalent series resistance can be suppressed low.

In the tuning fork type crystal oscillator 110 having such an H shaped cross section, the tines 112 and 113 are caused to vibrate, when a voltage is applied from the outside. The vibration causes a drive current to flow through the series resistance part of the equivalent circuit. A groove electrode is formed in each of the grooves 112a and 113a which are formed on the front and rear surfaces of the tines 112 and 113, and a side surface electrode is formed on each of side surfaces (surfaces on which the grooves 112a and 113a are not formed) 112b and 113b of the tines 112 and 113. Then, when a voltage is applied, an electric field is produced between the groove electrode and the side surface electrode, to thereby cause the part of the tines 112 and 113 on the left and right side of the groove to be expanded and contracted in the directions opposite to each other due to the piezo-electric effect. As a result, flex vibrations in the directions opposite to each other are produced in the tines 112 and 113, so as to enhance the Q value of the oscillator. Thereby, a current is made to flow between the side surface electrode and the groove electrode.

However, the current needs to be supplied to the side surface electrode and the groove electrode from the outside. Specifically, the current is supplied to the groove electrode and the side surface electrode from the outside via a base electrode provided for a base 111 of the tuning for k type crystal oscillator 110. For this reason, connecting electrodes for connecting the base electrode with the groove electrode and the side surface electrode are needed. Among these connecting electrodes, a connecting electrode for groove electrode for connecting the base electrode with the groove electrode is arranged on the base surface 111c in FIG. 7A. Further, a groove/side surface connecting electrode for connecting the groove electrode with the side surface electrode is arranged, for example, on the base surface 111c and the tine surface 112c.

In such a tuning fork type crystal oscillator 110 having the H shaped cross section, it is possible to shorten the distance between the groove electrode of the grooves 112a and 113a, and the side surface electrode of the side surfaces 112b and 113b, and to apply an electric field in the direction almost in parallel with the x axis of the quartz, and to enhance the electromechanical conversion efficiency based on the piezo-electric effect. Thus, when a drive voltage is applied between the electrodes, the tuning for k type crystal oscillator 110 is easily deformed so as to allow the current to flow. That is, the tuning fork type crystal oscillator 110 having the H shaped cross section is more advantageous than a conventional tuning fork type crystal oscillator without grooves in reducing the CI value.

However, in connection with the tuning fork type crystal oscillator 110 having the H shaped cross section, for example, there is a case where a small-sized oscillator having a resonance frequency of 32.768 kHz is required. In accordance with this requirement, the width of the tines 112 and 113 shown in FIG. 7A is reduced to, for example, 0.1 mm, and the width of the grooves 112a and 113a is reduced to, for example, about 0.07 mm. Accordingly, the width W of the region (hatched region in FIG. 7A) on the tine surface 112c, in which region the base electrode and side surface electrode are connected with each other, is limited to, for example, 0.015 mm. Here, the width of the groove/side surface connecting electrode which is to be arranged on the tine surface 112c needs to be at least about 0.01 mm. This results in that the gap between the groove/side surface connecting electrode and the groove electrode can be allowed to only 0.005 mm. In view of an error produced in the actual manufacturing process, this results in problems that these electrodes are more likely to come into contact with each other, and to cause other short-circuits, thereby forming a cause of defects of the oscillator, and that when the oscillator is manufactured so as to eliminate such cause of defects, manufacturing costs of the oscillator are significantly increased.

Then, in order to improve such problems, there is proposed a tuning fork type crystal oscillator as disclosed in Japanese Patent Application Laid-Open No. 2003-87090. This tuning fork type crystal oscillator 100 is shown in FIG. 8A to FIG. 8C.

In FIG. 8A, tines 120 and 130 are upwardly projected from a base 140. Grooves 120a and 130a are formed on the front and rear surfaces of the tines 120 and 130, respectively. As a result, the cross section of the tines 120 and 130 is formed approximately into an H shape, as shown in FIG. 8C. In the tuning fork type crystal oscillator having such H shaped cross section, base electrodes 140d and 140f are formed in the base 140, and groove electrodes 120d and 130d are formed in the grooves 120a and 130a which are formed in the tines 120 and 130. Further, as shown in FIG. 8C, side surface electrodes 120e and 130e are formed on the both side surfaces of the tines 120 and 130. Among the side surface electrodes, the side surface electrodes 130e arranged on the side surfaces of the tine 130 are connected to the base electrodes 140d via a connection electrode 141 for side surface electrode shown in FIG. 8A, and the side surface electrodes 120e arranged on the side surfaces of the tine 120 are connected to the base electrode 140f via a connection electrode 142 for side surface electrode. On the other hand, the groove electrode 120d is connected to the base electrode 140d via a connection electrode 143 for groove electrode. Further, the groove electrode 130d is connected to the side surface electrode 120e of the tine 120 via a groove/side surface connecting electrode 144, and is eventually connected to the base electrode 140f through the side surface electrode 120e.

An example of the size of the oscillator in FIG. 8A is shown in FIG. 8B. The width of the tines 120 and 130 is 0.1 mm. The length of the grooves 130a and 120a is 0.8 mm, and the width of the grooves 130a and 120a is 0.07 mm in most parts except the lower part of the grooves. In the lower part of the grooves 130a and 120a, i.e., in the region ranging from the lower end of the grooves 130a and 120a to a height position upper by 0.2 mm from the lower end, the width of the grooves is narrowed to 0.05 mm. That is, the width of the grooves 130a and 120a is abruptly changed from 0.07 mm to 0.05 mm at the height position upper by 0.2 mm from the lower end of the grooves 130a and 120a.

As a result, as shown in FIG. 8B, on the left side of the lower part of the groove 120a on the tine 120 and 130, the width of which part is narrowed, a connecting electrode arrangement region S for arranging the groove/side surface connecting electrode 144 for connecting the groove electrode 120d with the side surface electrode 120e is formed.

In this way, in the tuning fork type crystal oscillator 100 shown in FIG. 8A, the width of the lower part of the groove is made narrower than the width of the part above the lower part, thereby making it possible to more widely secure the connecting electrode arrangement region S by the amount obtained by narrowing the width of the groove. Thus, by arranging the groove/side surface connecting electrode 144 in the region S, the occurrence of a short circuit between the groove/side surface connecting electrode 144 and the groove electrode 120d is suppressed.

However, the conventional tuning fork type crystal oscillator shown in FIG. 8A and FIG. 8B, in which the region for arranging the connecting electrode for connecting the groove electrode with the side surface electrode is secured by making the width of the groove formed into two steps in this way, has problems as described below, that is:

(1) The plane shape of the grooves 120a and 130a does not become a simple rectangular shape, but becomes a stepped shape. Thereby, when the grooves are formed by etching, the grooves actually tend to be formed in such a manner that the wide width part of the grooves is deeply etched, and that the narrow width part of the grooves is shallowly etched.

FIG. 9 is a sectional view of the groove 120a taken along the center line c shown in FIG. 8B. As shown in FIG. 9, the depth of the groove 120a is formed to become shallow from a position apart by 0.2 mm from the base 140 so as to correspond to the width of the groove, and a somewhat gradually stepped shape is formed. Here, the rising inclination of the step is not necessarily fixed, but tends to be changed within the range as shown by the dotted lines. This is due to the fact that at the place where the width of the groove is changed stepwise, the etching depth tends to follow the change of the width of the groove and to be abruptly changed, but in practice, the change in the etching depth is delayed under the influence of various factors affecting the etching rate, thereby causing significant variation in the inclination of the step in the depth. For this reason, there are not small number of cases where the three dimensional forms of the grooves in the left and right tines are not coincident with each other but slightly different from each other. As a result, there may be a case where the rigidity in the part close to the root of the left and right tines is slightly different for each of the left and right tines, so that the cancellation of vibrations in the left and right tines is not sufficiently performed, thereby causing the Q value to be lowered and the CI value to be increased.

(2) Next, in the narrow width parts in the grooves 130a and 120a, the distance between the groove electrodes 120d and 130d in the grooves, and the surface electrodes 120e and 130e on the side surfaces becomes large. This causes the strength of electric field (electric field in the electric axis direction of crystal) applied between the side surface and the groove in these parts to be reduced. In this case, the electric field strength is reduced in the parts close to the root of the tines 120 and 130, so that the driving force for deforming the tines is reduced, and the electromechanical conversion coefficient is lowered. This results in a disadvantage in driving the tuning fork type crystal oscillator 100 and in enabling a sufficient current to flow, and causes the CI value to be deteriorated.

Further, there is disclosed a tuning fork type crystal oscillator having grooves formed in tines, in Japanese Patent Application Laid-Open No. 2003-133895, in which in the part close to the lower end of the groove, the width of the groove is gradually reduced toward the lower end of the groove so as to allow the depth of the groove to be gradually changed in this part, thereby preventing disconnection of groove electrodes. However, the lower part of the groove, the width of which is gradually reduced, is not formed in the tine of the tuning fork type crystal oscillator, but is formed in the base, and hence, does not make any contribution to the formation of a region for arranging a connecting electrode for effecting connection between electrodes.

Accordingly, an object of the present invention is to improve the above described problems in the conventional tuning fork type crystal oscillator as exemplified in FIG. 8A to FIG. 8C. A further object of the present invention is to reduce the CI value as compared with the conventional one, while securing reliable connection to side surface electrodes in a small-sized tuning fork type crystal oscillator having grooves in the left and right tines.

DISCLOSURE OF THE INVENTION

A quartz piece according to the present invention has a base and at least two tines extending from the base, and is constituted in such a manner that a groove is formed on at least one of the front and rear surfaces of the tine along the lengthwise direction of the tine, and that a gap from at least one side surface of the tine to the groove is gradually increased toward the base.

In this quartz piece, the width of the groove may also be arranged to be gradually decreased toward the base, while the width of the tine is arranged to be fixed through the whole length of the tine.

In this quartz piece, the width of the tine may also be arranged to be gradually increased toward the base, while the width of the groove is arranged to be fixed through the whole length of the groove.

In this quartz piece, a groove electrode can be formed in the groove and a side surface electrode can be formed in the side surface of the tine, respectively.

An oscillator according to one aspect of the present invention has a base and at least two tines extending from the base, and is constituted in such a manner that a groove is formed on at least one of the front and rear surfaces of the tine along the lengthwise direction of the tine, that a groove electrode is formed in the groove, and a side surface electrode is formed in the side surface of the tine, and that the width of the tine is fixed through the whole length of the tine, while the width of the groove is gradually decreased toward the base, so that an arrangement area of a connecting electrode is formed in the part of the tine except the groove.

In this oscillator, the width of the groove may also be linearly reduced.

In this oscillator, the tine and the groove formed in the tine may also be arranged to be symmetric with respect to the center line of the tine.

This oscillator can be formed with a tuning fork type crystal oscillating piece.

Further, an oscillator according to another aspect of the present invention has a base and at least two tines extending from the base, and is constituted in such a manner that a groove is formed on at least one of the front and rear surfaces of the tine along the lengthwise direction of the tine, that a groove electrode is formed in the groove, and a side surface electrode is formed in the side surface of the tine, and that the width of the groove is fixed through the whole length of the groove, while the width of the tine is gradually increased toward the base.

The width of the tine may also be linearly increased.

BEST MODE FOR CARRYING OUT THE INVENTION

First, an oscillator according to an embodiment 1 of the present invention is explained by using FIG. 1A to FIG. 1C, and FIG. 2.

Figure 1:
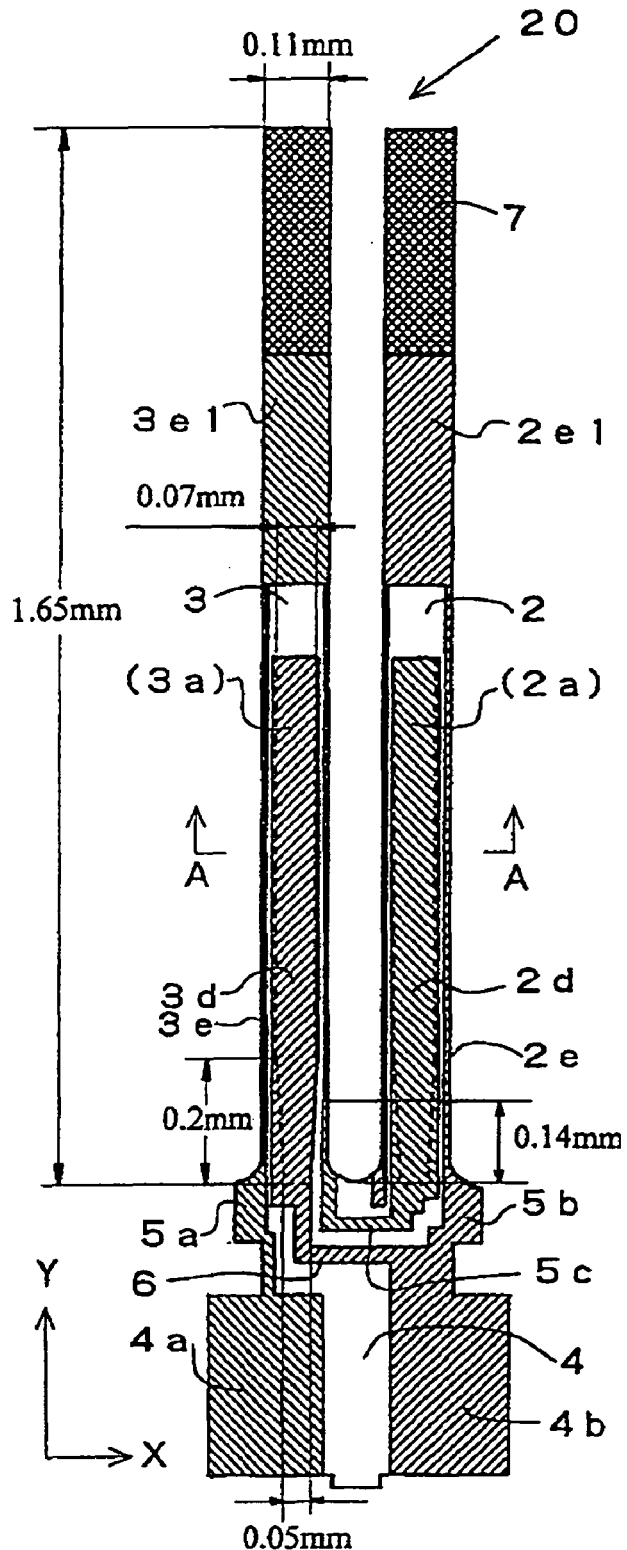
FIG. 1A is a top view of a tuning fork type crystal oscillator according to an embodiment 1 of the present invention.
FIG. 1B is a top view showing a tuning fork type quartz piece with electrodes removed from the crystal oscillator in FIG. 1A.
FIG. 1C is a sectional view along the line A-A shown in FIG. 1A.
Figure 1:
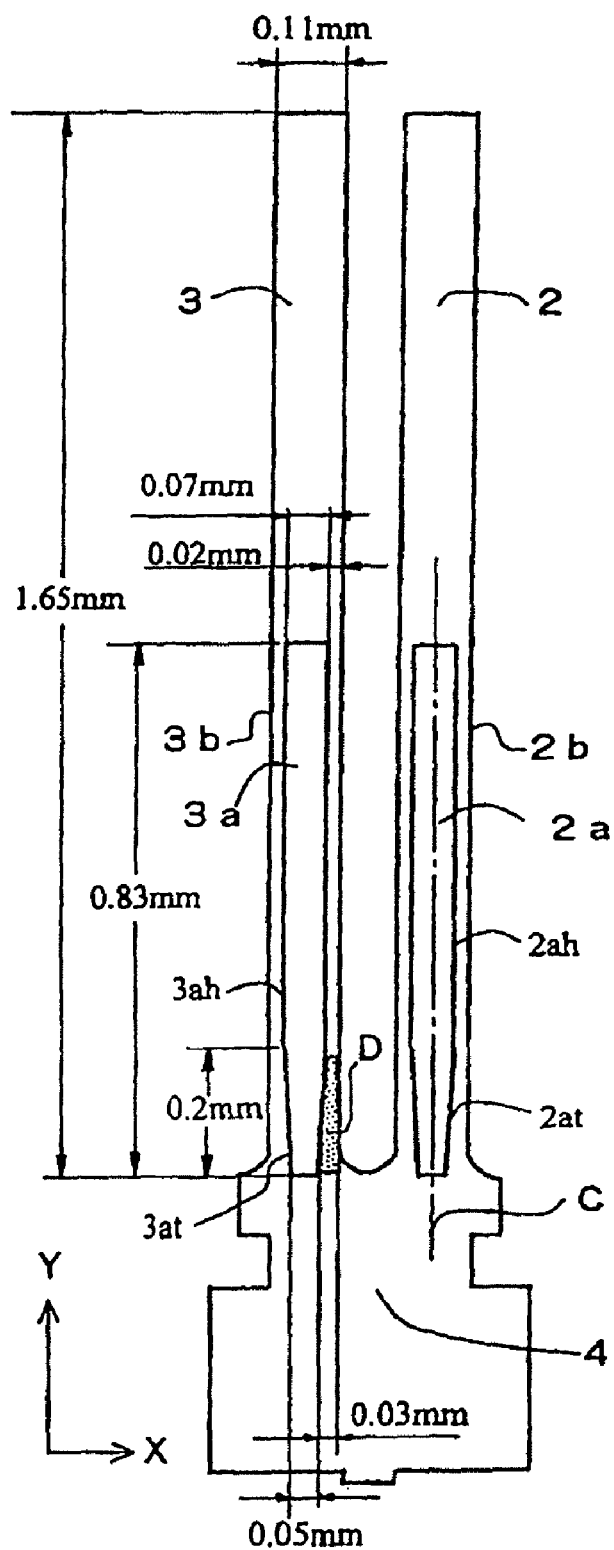
Figure 1:
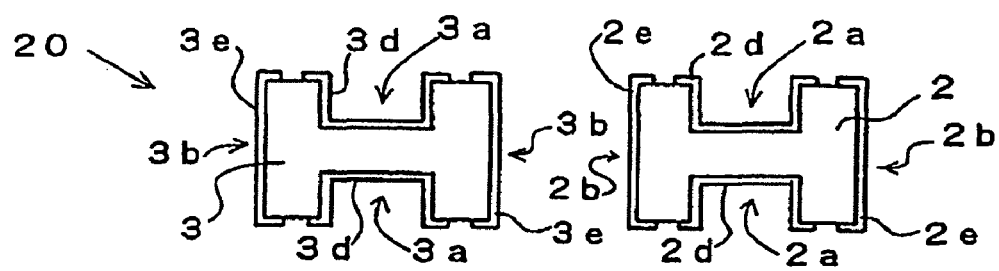

A tuning fork type crystal oscillator 20 shown in FIG. 1A is formed in such a manner that a quartz piece is cut out into a plate shape from a single crystal of quartz, and then processed to a tuning fork shape. In the plate state before the quartz piece is processed into a tuning fork shape, a so-called quartz z plate is cut out, in which in a three-axis orthogonal coordinate system consisting of a x axis (electric axis), a y-axis (mechanical axis), and a z-axis (optical axis) of the single crystal, an xy plane formed by the x-axis and the y-axis is slightly inclined counterclockwise about the x-axis. The tuning fork type crystal oscillator 20 is formed from the quartz z plate.

In FIG. 1A and FIG. 1B, in the three-axis orthogonal coordinate system consisting of an X-axis, a Y-axis, and a Z-axis, the X-axis is coincident with the x axis, while the Y axis is slightly inclined from the y-axis. In these figures, two tines 2 and 3 are projected in parallel with the Y axis direction from a base 4 of the tuning fork type crystal oscillator 20. On the front surface of the tines 2 and 3, as shown in FIG. 1B, grooves 2a and 3a are respectively formed by a predetermined distance along the lengthwise direction of the tines 2 and 3. Further, grooves 2a and 3a are also formed in positions on the rear surface of the tines 2 and 3, which correspond to the grooves 2a and 3a on the front surface of the tines 2 and 3, respectively. Because of the formation of the grooves 2a and 3a on the front and rear surfaces of the tines 2 and 3, the cross section of the tines 2 and 3 assumes approximately an H shape, as shown in FIG. 1C.

Electrodes formed in the tuning fork type crystal oscillator 20 are explained below.

Base electrodes 4a and 4b are formed in the base 4. Groove electrodes 2d and 3d are formed in the grooves 2a and 3a of the tines 2 and 3.

As shown in FIG. 1C, side surface electrodes 2e and 3e are formed in right and left side surfaces 2b and 3b of the tines 2 and 3, respectively. Among these side surface electrodes 2e and 3e, side surface electrodes 2e, which are respectively formed on the inner side surface (the surface facing the tine 3) of the tine 2 and on the outer side surface (the surface on the side opposite to the tine 3), are connected with each other via a connecting electrode 2e1 for connecting side surface electrodes shown in FIG. 1A. Further, side surface electrodes 3e, which are respectively formed on the inner side surface (the surface facing the tine 2) of the tine 3 and on the outer side surface (the surface on the side opposite to the tine 2) are connected with each other via a connecting electrode 3e1 for connecting side surface electrodes shown in FIG. 1A. Note that these connecting electrodes 2e1 and 3e1 for connecting side surface electrodes have also a role to finely adjust the frequency.

Figure 2:
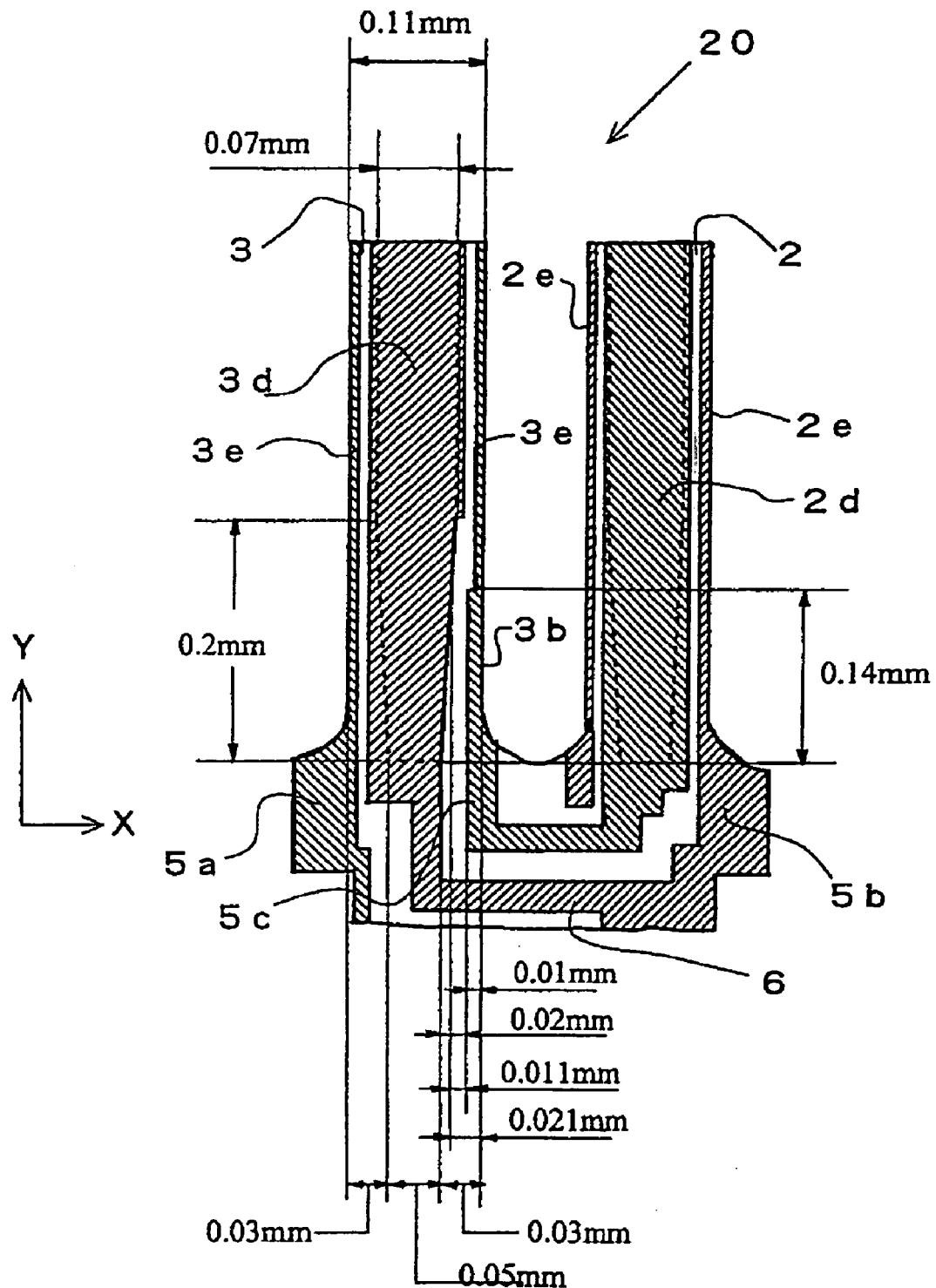
FIG. 2 is an enlarged view of the main part of the crystal oscillator in FIG. 1A.

The base electrode 4a is connected to the side surface electrode 3e via a connecting electrode 5a for side surface electrode. Further, the base electrode 4b is connected to the side surface electrode 2e via a connecting electrode 5b for side surface electrode, and is also connected to the groove electrode 3d of the tine 3 via a connecting electrode 6 for groove electrode. Further, the groove electrode 2d of the tine 2 is connected to the side surface electrode 3e on the inner side surface of the tine 3 via a groove/side surface connecting electrode 5c, as shown in FIG. 2.

As shown in FIG. 1A, thick films 7 for frequency adjustment are formed on the upper ends of the tines 2 and 3. These thick films 7 are formed of Cr, Ag, and the like.

In the above described constitution of electrodes, on the front surface side of the tuning fork type crystal oscillator 20, the base electrode 4b is connected to the side surface electrodes 2e on the outer and inner sides of the tine 2, and to the groove electrode 3d of the tine 3. Further, the base electrode 4a is connected to the side surface electrodes 3e on the outer and inner sides of the tine 3 and to the groove electrode 2d of the tine 2. On the other hand, on the rear surface side of the tuning fork type crystal oscillator 20, the groove electrode 3d of the tine 3 is connected to the base electrode 4b by a connecting electrode (not shown) provided on the rear side of the base 4. Further, the groove electrode 2d of the tine 2 is connected to the base electrode 4a similarly to the front surface side of the tuning fork type crystal oscillator 20. In short, the groove electrode 2d of the tine 2 and the side surface electrode 3e of the tine 3 are conductive to the one base electrode 4a, while the groove electrode 3d of the tine 3, and the side surface electrode 2e of the tine 2 are conductive to the other base electrode 4b.

Here, the base 4 of the tuning for k type crystal oscillator whose electrodes are formed and connected as described above, is fixed to a terminal of a case (not shown). In this state, assume that a positive voltage is applied to one base electrode 4a, and a negative voltage is applied to the other base electrode 4b.

Then, in the tine 2, the potential of the groove electrode 2d becomes positive, and the potential of the side surface electrode 2e becomes negative, as a result of which an electric field is formed in the direction from the groove electrode 2d to the side surface electrode 2e. On the other hand, in the tine 3, the potential of the groove electrode 3d becomes negative, and the potential of the side surface electrode 3e becomes positive, as a result of which an electric field is formed in the direction from the side surface electrode 3e to the groove electrode 3d. Here, assume that the electric field in the +X direction as shown in FIG. 1A causes the stress of expansion to be generated in the quartz, while the electric field in the −X direction causes the stress of compression to be generated in the quartz. Then, the part (wall) of the tine 2 on the right side of the groove 2a (on the side opposite to the tine 3) is expanded in the Y axis direction, and the part (wall) of the tine 2 on the left side of the groove 2a (on the side of the tine 3) is compressed in the Y axis direction. As a result, the tine 2 tends to be deflected to the left side (to the side of the tine 3). On the other hand, the part (wall) of the tine 3 on the left side of the groove 3a (on the side opposite to the tine 2) is expanded in the Y axis direction, and the part (wall) of the tine 3 on the right side of the groove 3a (on the side of the tine 2) is compressed in the Y axis direction. As a result, the tine 3 tends to be deflected to the right side (to the side of the tine 2). That is, when a positive voltage is applied to the base electrode 4a and a negative voltage is applied to the base electrode 4b, both the tines 2 and 3 tend to be deflected to the inside.

Next time, assume that a negative voltage is applied to one base electrode 4a, and a positive voltage is applied to the other base electrode 4b, contrary to the fist case. Then the direction of the electric field in the tines 2 and 3 becomes opposite to the above described first case, as a result of which the both tines 2 and 3 tend to be deflected to the outside.

The driving principle of the tuning fork type crystal oscillator is already known.

In the following, features of the oscillator according to the present invention will be described.

The tuning fork type crystal oscillator 20 according to an embodiment of the present invention has the tines 2 and 3 in which the grooves 2a and 3a are formed on the front and rear surfaces thereof to extend from the base 4 to the approximate center part of the oscillator. In a part of each of these grooves 2a and 3a that is adjacent to the lower end thereof, the width of that part of the groove is linearly reduced toward the lower end of the groove, so that this part is formed into a tapered groove region. The width of the grooves 2a and 3a except this tapered groove region is fixed.

Specific examples of these dimensions are explained below by using FIG. 1B.

The length (dimension in the Y axis direction) of the tines 2 and 3 is 1.65 mm, and the width (dimension of the X axis direction) of the tines 2 and 3 is 0.11 mm. The length of the grooves 2a and 3a formed in these tines 2 and 3 is 0.83 mm. Note that the lower end of the grooves 2a and 3a are coincident with the root (lower end) of the tines 2 and 3 at a position (height) in the Y axis direction.

For these grooves 2a and 3a, as shown in FIG. 1B, tapered groove regions, in which the width of the groove is gradually reduced toward the lower end, are formed in a part from the lower end of the groove to a position upper by 0.2 mm from the lower end of the groove in the Y axis direction. That is, in these tapered groove regions, wall surfaces 2ah and 3ah are formed as inclined surfaces 2at and 3at, respectively. On the other hand, in the grooves 2a and 3a, the upper part except the tapered groove region has a fixed width of 0.07 mm. The width of the lower end of the tapered groove region in the grooves 2a and 3a is 0.05 mm. Therefore, in the tapered groove region of the grooves 2a and 2b, the groove width changes linearly from the upper part towards the lower part in a range from 0.07 mm to 0.05 mm.

In the upper part (equal width part) of the grooves 2a and 3a, the X axis direction distance from the side surfaces 2b and 3b on the right and left of the tines 2 and 3 to the grooves 2a and 3a is (0.11−0.07)/2=0.02 mm. On the other hand, in the lower end (lower end of the tapered groove region) of the grooves 2a and 3a, the X axis direction distance from the side surfaces 2b and 3b on the right and left of the tines 2 and 3 to the grooves 2a and 3a is (0.11−0.05)/2=0.03 mm. As a result, as shown by region D in FIG. 1B, trapezoidal wiring regions with the upper side of 0.02 mm, the bottom side of 0.03 mm, and the height of 0.2 mm are formed on both left and right sides of the tapered groove region on the front and rear surfaces of the tines 2 and 3, respectively.

Then, in order to arrange the groove/side surface connecting electrode 5c having the width of 0.01 mm in the trapezoidal wiring region D on the right side of the tapered groove region in the groove 3a of the tine 3, the gap between this electrode 5c and the groove electrode 3d formed in the groove 3a can be secured to 0.01 mm or more in the region from the root (lower end) of the tine 3 to a position upper by about 0.14 mm in the Y axis direction from the root of the tine 3, as shown in FIG. 2. As a result, the short circuit between the electrodes in the manufacturing process can be surely prevented. Note that in the present embodiment, each external shape of the grooves 2a and 3a is made right and left symmetric to the center line (for example, the broken dotted line C in FIG. 1B) in the Y axis direction. This is intended to reduce the leakage of vibration in the Y axis direction.

A feature of the present embodiment 1 is that the trapezoid regions D are formed on the right and left of the tapered groove region in the grooves 2a and 3a of the tines 2 and 3, respectively, and thereby the gap between the groove electrode 2d and the side surface electrode 2e, and the gap between the groove electrode 3d and the side surface electrode 3e are respectively formed into the trapezoidal shape corresponding to the region D. That is, the width of the gap between the groove electrode 3d and the side surface electrode 3e is gradually changed in the Y axis direction.

Figure 8:
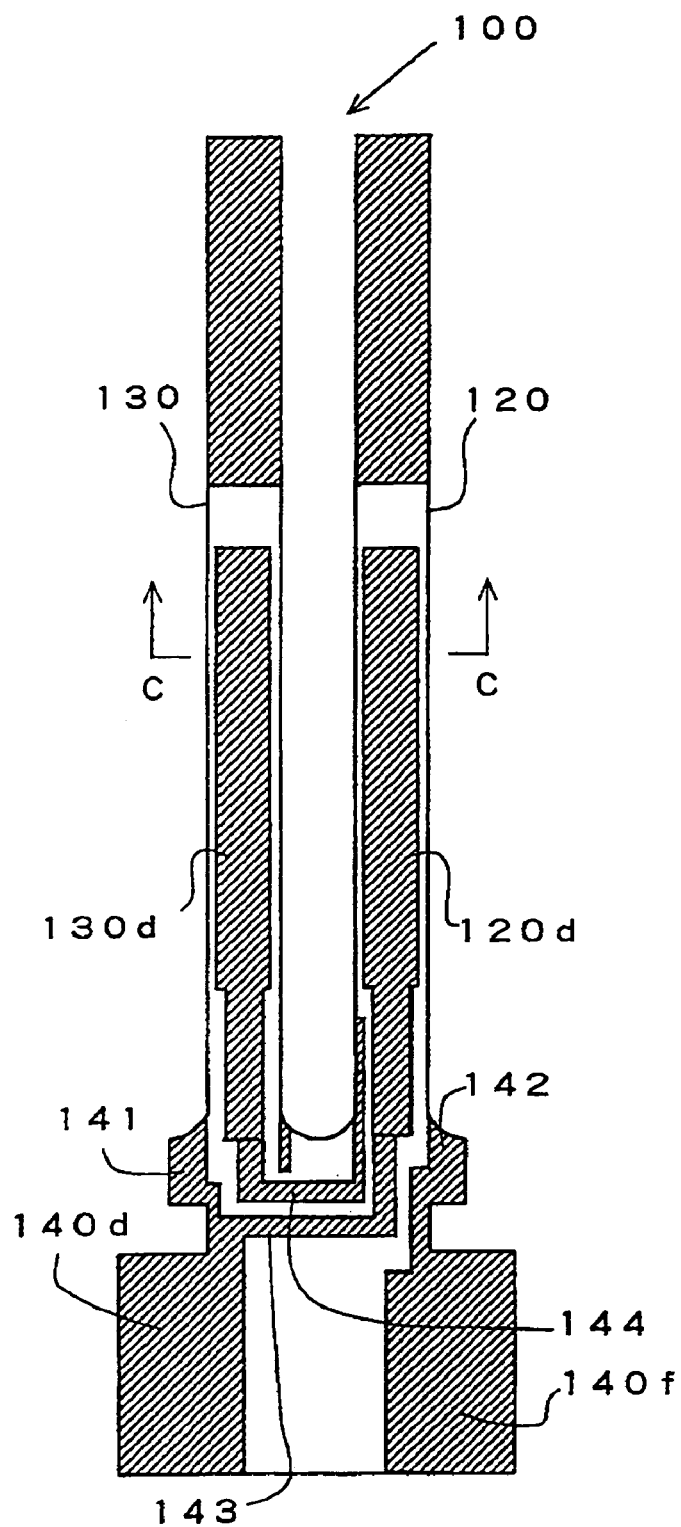
FIG. 8A is a top view of a conventional tuning fork type crystal oscillator having stepped grooves.
FIG. 8B is a top view showing the tuning fork type quartz piece with electrodes removed from the crystal oscillator in FIG. 8A.
FIG. 8C is a sectional view along the line C-C shown in FIG. 8A.
Figure 8:
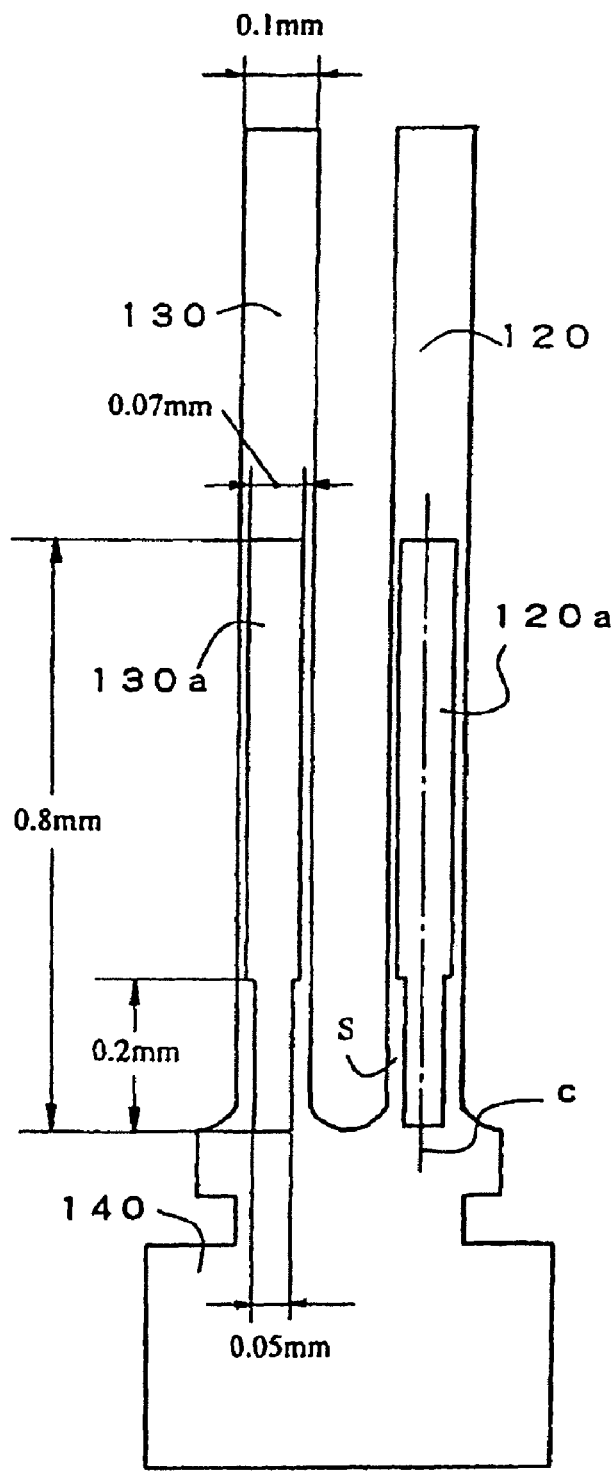
Figure 8:
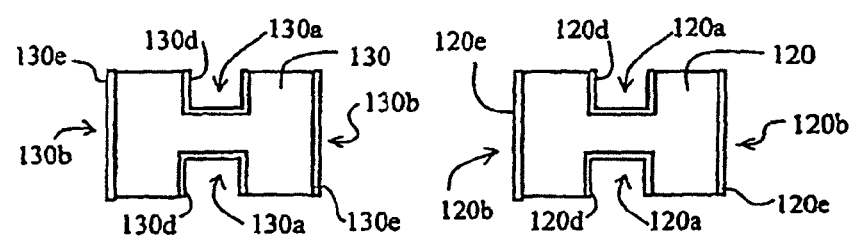

As a result, in the embodiment 1, the average value of the gap between the groove electrode and the side surface electrode can be reduced, as compared with the case where the gap between the groove electrode and the side surface electrode is formed into two steps of the upper wide width part and a lower narrow width part, as in the prior art example shown in FIG. 8A and FIG. 8B. Thereby, the average value of the field strength between the groove electrode and the side surface electrode can be increased as compared with the conventional one. In particular, the increase in the field strength in the part close to the root of the tines 2 and 3 is extremely effective to increase the driving force of the tines 2 and 3, resulting in an increase in the electromechanical conversion coefficient and a reduction in the CI value.

Figure 4:
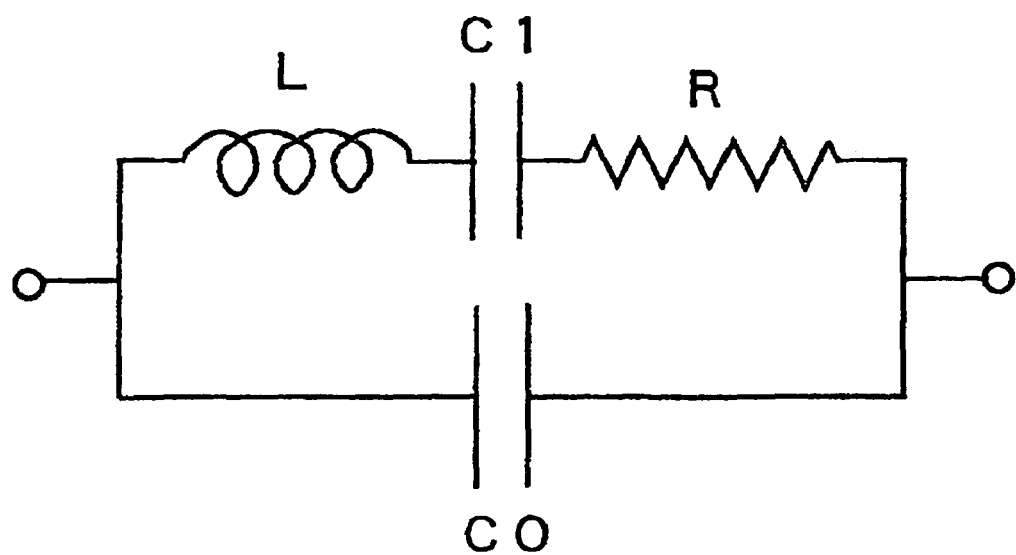
FIG. 4 is a figure showing an equivalent circuit of the tuning fork type crystal oscillator in FIG. 1A.

FIG. 4 is an equivalent circuit of a piezoelectric oscillator, such as a crystal oscillator, represented by a four element equivalent circuit constants of L, C1, R, and C0. Here, when f is assumed to be the resonance frequency of the crystal oscillator, the relationship between the CI value and the equivalent circuit constants is expressed by the following formula (I).

$$CI = 1/(C1 \cdot 2\pi f \cdot Q) \quad (1)$$

Meanwhile, the increase in the electromechanical conversion coefficient, as described above, facilitates the flow of current caused by the deformation of quartz, and thereby a ratio (C1/C0) of series capacitance C1 which is to be referred to as the dynamic capacitance, to the parallel capacitance C0 is increased. Note that a current flows through the parallel capacitance C0 even if the quartz is not deformed. For this reason, provided that C0 is substantially fixed, when the electromechanical conversion coefficient is increased, C1 is increased. Further, when the series capacitance C1 is increased, the CI value is decreased in accordance with the above formula (I).

Another feature of the present embodiment is that because of the shapes of the grooves $2a$ and $3a$ provided on the tines 2 and 3, the Q value of the oscillator is improved, as compared with the conventional tuning fork type crystal oscillator having the stepped grooves.

Figure 3:
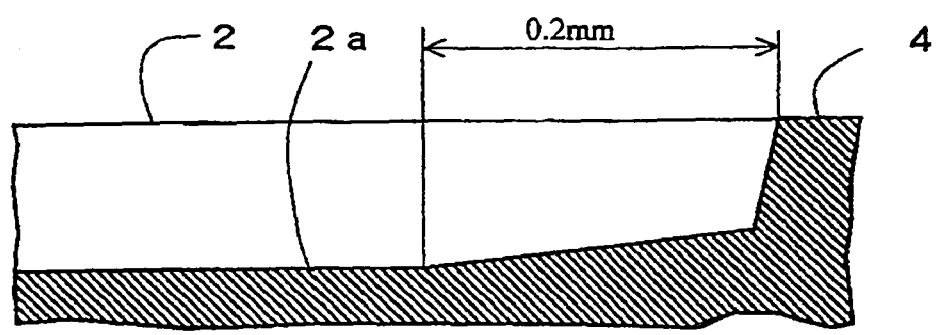
FIG. 3 is a sectional view along the center line C in FIG. 1B, showing a state of the depth of a groove of the tuning fork type crystal oscillator shown in FIG. 1B.

The grooves $2a$ and $3a$ of the tines 2 and 3 are formed by etching. Here, a cross sectional shape of the groove $2a$ is shown in FIG. 3 (a cross sectional shape of the groove $3a$ is the same as that of groove $2a$). As shown in FIG. 3, in the part (equal width part) which is apart by 0.2 mm or more from the base 4 of the groove $2a$, the depth of the groove is fixed. However, in the part (tapered groove region) from base 4 of the groove $2a$ to the place apart by 0.2 mm from the base 4, the depth of the groove is made to become shallower toward the base 4. In this way, in the part close to the base 4 (in the tapered groove region from the base 4 to the position apart by 0.2 mm from the base 4 in the embodiment 1), the grooves $2a$ and $3a$ of the tines 2 and 3 are formed in such a manner that the width of the groove is linearly reduced toward the base 4, and the depth of the groove is also linearly reduced toward the base 4.

Figure 9:
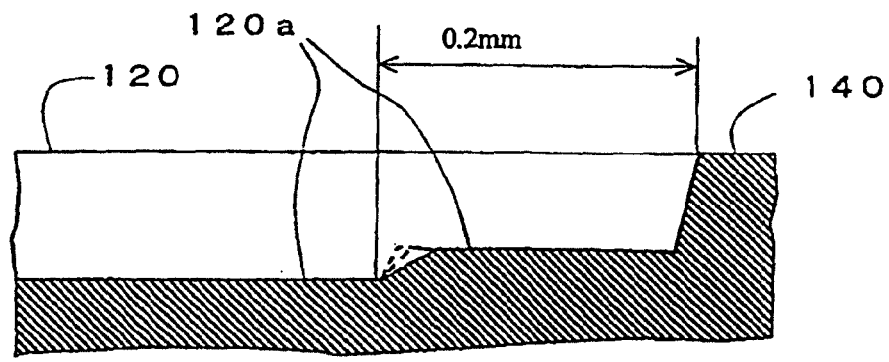
FIG. 9 is a sectional view of the groove taken along the center line c shown in FIG. 8B.

As a result, in the embodiment 1, the difference in rigidity between the tine 2 and the tine 3 can be reduced, as compared with the prior art example in which the width of the groove is abruptly changed at one position in the lengthwise direction of the groove (FIG. 8B), and in which the depth of the groove is also abruptly changed at the same position (FIG. 9). Accordingly, the vibrations caused at the time when the tine 2 and the tine 3 are vibrated in mutually reverse phases, can be sufficiently cancelled, and thereby a high Q value can be obtained. Further, with the increase in the Q value, the CI value is decreased in accordance with the above formula (1).

In the following, electrical properties of the conventional tuning fork type crystal oscillator having the stepped grooves as shown in FIG. 8A, are explained by using Table 1A. Further, electrical properties of the tuning fork type crystal oscillator having the grooves, in the lower part of which the tapered groove regions are formed, according to the embodiment 1 of the present invention as shown in FIG. 1A, are explained by using Table 1B. Here, both the tuning fork type crystal oscillators have the same dimensions of outer shape, the same groove lengths, and the same maximum and minimum widths of the groove. The resonance frequency of both the tuning fork type crystal oscillators is also set to 32 kHz.

TABLE 1A

Electrical properties of tuning fork type crystal oscillator having stepped grooves

| No. | CI (kΩ) | C0 (pF) | Q | C1 (fF) | L (H) | C0/C1 |
|---|---|---|---|---|---|---|
| 1-1 | 52.3 | 1.00 | 29866 | 3.16 | 7722 | 316 |
| 1-2 | 58.3 | 0.96 | 26788 | 3.16 | 7713 | 304 |
| 1-3 | 58.3 | 0.97 | 26597 | 3.19 | 7681 | 304 |
| 1-4 | 52.9 | 0.97 | 29356 | 3.18 | 7661 | 305 |
| Average value | 55.5 | 0.98 | 28152 | 3.17 | 7694 | 307 |
| Standard deviation | 3.3 | 0.02 | 1629 | 0.01 | 25 | 6 |

TABLE 1B

Electrical properties of tuning fork type crystal oscillator having tapered grooves

| No. | CI (kΩ) | C0 (pF) | Q | C1 (fF) | L (H) | C0/C1 |
|---|---|---|---|---|---|---|
| 2-1 | 49.3 | 0.99 | 30100 | 3.36 | 7388 | 295 |
| 2-2 | 51.6 | 0.99 | 28694 | 3.37 | 7379 | 294 |
| 2-3 | 48.7 | 1.00 | 30168 | 3.39 | 7319 | 295 |
| 2-4 | 51.1 | 1.00 | 29045 | 3.37 | 7414 | 297 |
| 2-5 | 47.8 | 1.00 | 30882 | 3.38 | 7357 | 296 |
| Average value | 49.7 | 1.00 | 29774 | 3.37 | 7371 | 295 |
| Standard deviation | 1.6 | 0.02 | 886 | 0.01 | 36 | 1 |

From Table 1A and Table 1B, it can be seen that the Q value (average value) of the conventional tuning fork type crystal oscillator having the stepped grooves is 28152, and the standard deviation thereof is 1629, while the Q value (average value) of the tuning fork type crystal oscillator having the tapered groove regions according to the embodiment 1 of the present invention is 29774, and the standard deviation thereof is 886. That is, in the embodiment 1, as compared with the prior art example, the Q value is improved by about 6%, and the standard deviation (variation) is reduced to about half. This is due to the fact that in the tuning fork type crystal oscillator having the tapered groove regions according to the embodiment 1, there is little variation in the three-dimensional form including the depth of the grooves, as described above, and thereby the rigidity is well balanced for the left and right tines.

Further, the series capacitance C1 (average value) of the conventional tuning fork type crystal oscillator having the stepped grooves is 3.17 fF, while the series capacitance C1 (average value) of the tuning fork type crystal oscillator having the tapered groove regions according to the embodiment 1 of the present invention is 3.37 fF. Thus, according to the embodiment 1, the series capacitance C1 is increased by about 6%, as compared with the prior art example. The reason for this is already explained.

As described above, in the tuning fork type crystal oscillator according to the embodiment 1, both the Q value and the series capacitance C1 are increased as compared with the conventional tuning fork type crystal oscillator, so that the CI value is decreased in accordance with the above formula (I). That is, in the case of the tuning fork type crystal oscillator having the tapered groove regions, the CI value (average value) is decreased by about 12% from 55.5 kΩ to 49.7 kΩ, as compared with the tuning fork type crystal oscillator having the stepped grooves. Further, in the embodiment 1, the variation in the CI value is also decreased as compared with the case of the prior art example.

Note that, as described above, the electrical properties of the tuning fork type crystal oscillators are shown in Table 1A and Table 1B in order to compare the embodiment 1 of the present invention with the prior art example. However, the oscillator according to the present invention is not limited to the tuning fork type crystal oscillator, and the oscillator may also be a tuning fork piezoelectric vibrator which has tapered grooves of the same shape, and which is formed by using other piezoelectric materials, such as barium titanate. Also in this case, it is possible to obtain comparison results between the tuning fork type piezoelectric vibrator according to the present invention, having such constitution, and the conventional tuning fork type piezoelectric vibrator, which comparison results are similar to the comparison results shown in Table 1A and Table 1B, because of the same principle as described above.

Note that in the tuning fork type crystal oscillator (oscillator 20 shown in FIG. 1A) according to the present embodiment 1, the tapered groove regions are provided in the part close to the lower end of the grooves which are formed in the tines 2 and 3 of the tuning fork. Accordingly, the distance between driving electrodes which are separated by the tapered groove region is gradually reduced toward the root of the tines 2 and 3, resulting in the effects that the wiring region is secured, and that the CI value is reduced due to the improvement in the field strength in driving the oscillator.

Note that the constitution itself, in which the tapered groove region is formed in the part close to the lower end of the groove in the tuning fork type crystal oscillator, is already disclosed in the above-mentioned Japanese Patent Application Laid-Open No. 2003-133895. However, this tapered groove region is not formed in the tine of the tuning fork, but is formed in a part lower than the root of the tine, i.e., in the base of the tuning fork. The purpose of forming this tapered groove region is to prevent disconnection in the groove electrode, when the groove electrode is formed by a photolithographic process on the groove which is formed in the tine of the tuning fork by an isotropic etching. Therefore, in the tuning fork type crystal oscillator disclosed in the above-mentioned patent document, it is not possible to obtain the effect of the embodiment 1 of the present invention, that the field strength is improved so as to reduce the CI value, and the wiring region is also expanded by gradually reducing the distance between driving electrodes separated by the tapered groove region, toward the root of the tines 2 and 3. Therefore, the tuning fork type crystal oscillator according to the embodiment 1 is completely different from the tuning fork type crystal oscillator disclosed in the above-mentioned patent document, in the objects, constitution, and operation effect.

Figure 5:
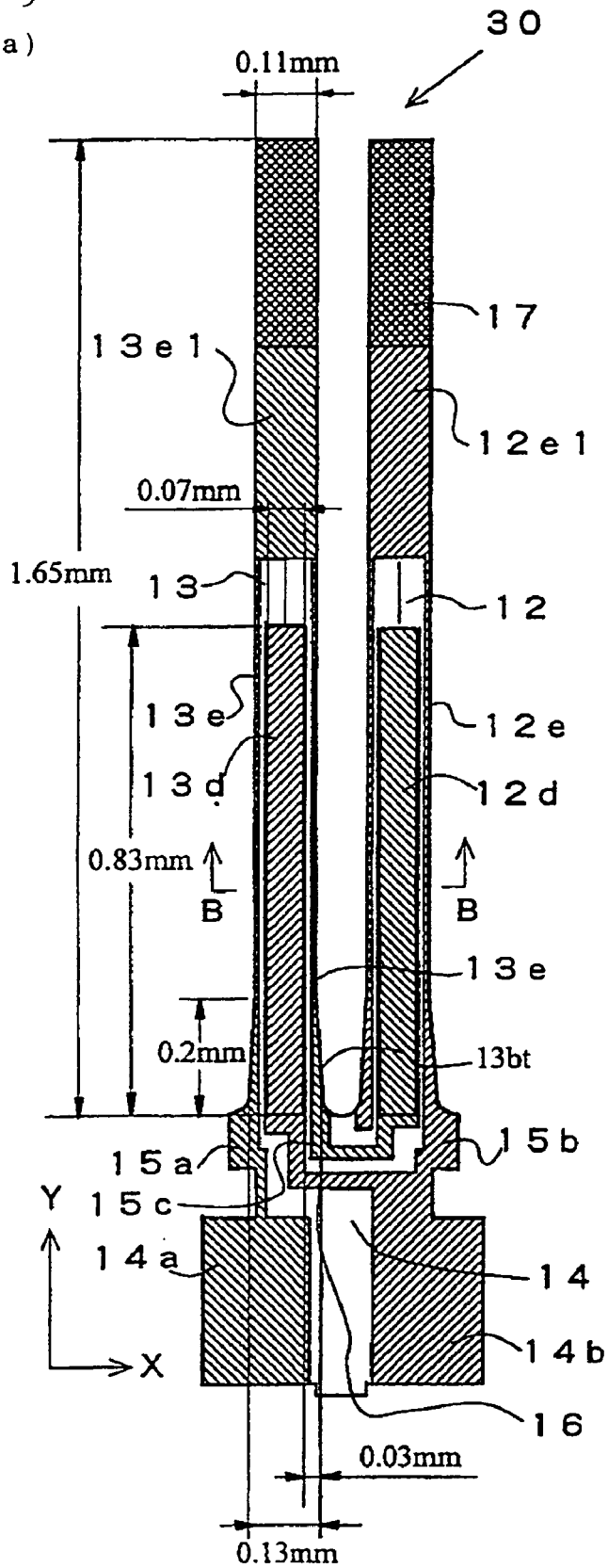
FIG. 5A is a top view of a tuning fork type crystal oscillator according to an embodiment 2 of the present invention.
FIG. 5B is a top view showing a tuning fork form quartz piece with electrodes removed from the crystal oscillator in FIG. 5A.
Figure 5:
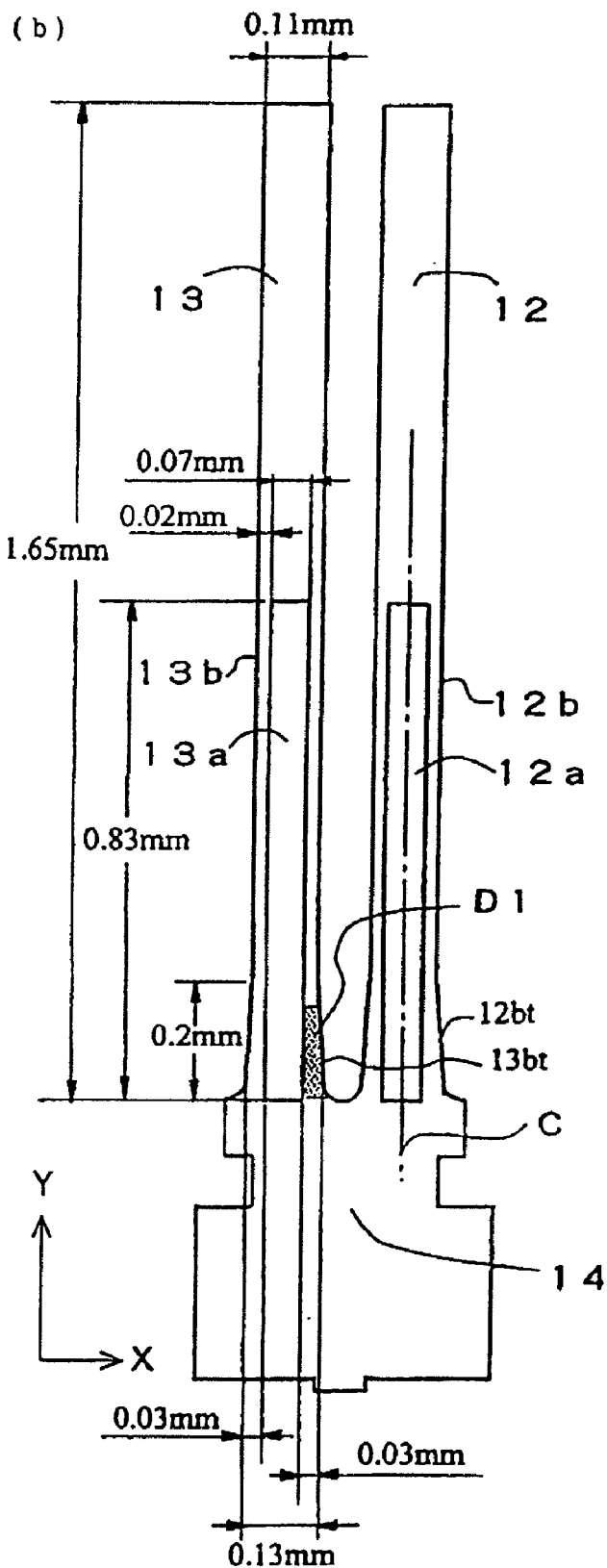
Figure 6:
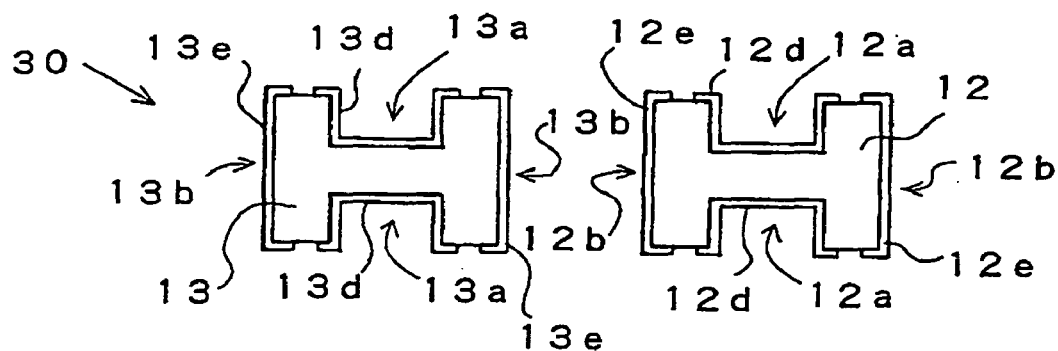
FIG. 6 is a sectional view along the line B-B shown in FIG. 5A.
Figure 7:
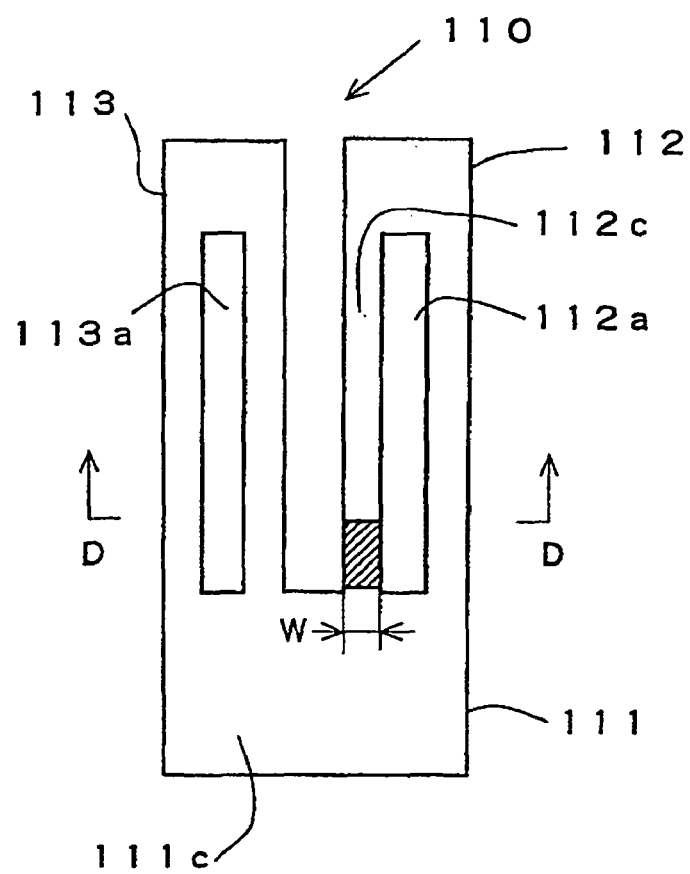
FIG. 7A is a top view showing a conventional tuning fork type crystal oscillator having grooved tines.
FIG. 7B is a sectional view along the line D-D shown in FIG. 7A.
Figure 7:
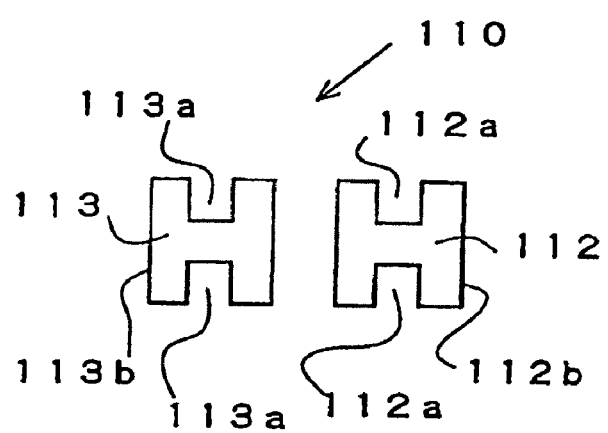

Next, an oscillator according to an embodiment 2 of the present invention is explained by using FIG. 5A to FIG. 6.

Two tines 12 and 13 are projected in the Y axis direction from a base 14 of a tuning fork type crystal oscillator 30 shown in FIG. 5A. As shown in FIG. 5B, on the front surface of these tines 12 and 13, grooves 12a and 13a each having a predetermined length are formed along the lengthwise direction of the tines 12 and 13, respectively. Further, grooves 12a and 13a each having a predetermined length are also formed on the rear surface of tines 12 and 13 in positions corresponding to the grooves 12a and 13a on the front surface side, respectively. The cross section of the tines 12 and 13 assumes approximately an H shape, as shown in FIG. 6, because of the formation of the grooves 12a and 13a on the front and rear surfaces of these tines 12 and 13.

The present embodiment is different from the embodiment 1 in that the grooves 12a and 13a are arranged to have a fixed width through the whole length (the dimension in the Y axis direction) of the grooves, while the width of the tines 12 and 13 is linearly increased toward the root of the tines 12 and 13, so as to make this part formed into a tapered root region. In the tapered root region in the tines, as shown in FIG. 5A and FIG. 5B, side surfaces 12b and 13b of the tines are formed into inclined surfaces 12bt and 13bt. The width of the tines 12 and 13 except this tapered root region is fixed.

The shapes of the tines 12 and 13 are symmetric with respect to the central axis C as a whole including the lower tapered root region. The effect obtained by making the shapes of the tines 12 and 13 symmetric with respect to the central axis C is the same as those explained in the embodiment 1.

In the following, an example of specific sizes in the tuning fork type crystal oscillator 30 according to this embodiment is explained.

The whole length (the dimension in the Y axis direction) of the tines 12 and 13 is 1.65 mm. The part from the root of the tines 12 and 13 to a position upper by 0.2 mm from the root, is formed into the tapered root region, the width of which is gradually changed. The width of the tapered root region is 0.13 mm at the lower end of the region (at the position of the root of the tine), while the width of the tapered root region is 0.11 mm at the upper end of the region (at the height of 0.2 mm from the lower end). The width of the part (equal width part) in the tines 12 and 13 except the tapered root region is 0.11 mm.

The Y axial position of the lower end of the grooves 12b and 13b formed in the tines 12 and 13 are substantially coincident with the Y axial position of the root of the tines 12 and 13. The length of the grooves 12b and 13b is 0.83 mm, and the width of the grooves 12b and 13b is set to be constant at 0.07 mm. In the part (equal width part) in the tines 12 and 13 except the tapered root region, the distance in the X axis direction from the side surfaces 12b and 13b of the tines 12 and 13 to the grooves 12a and 13a is uniformly set to (0.11−0.07)/2=0.02 mm. On the other hand, in the root of the tines 12 and 13, the distance in the X axis direction from the side surfaces 12b and 13b of the tines 12 and 13 to the grooves 12a and 13a is (0.13−0.07)/2=0.03 mm.

Thus, trapezoidal wiring regions D1 with the upper side of 0.02 mm, the bottom side of 0.03 mm, and the height of 0.2 mm are formed in the tapered groove regions on the front and rear surfaces of the tines 12 and 13, respectively.

In this tuning fork type crystal oscillator 30, the following electrodes are formed. Base electrodes 14a and 14b are formed in the base 14. Groove electrodes 12d and 13d are formed in the grooves 12a and 13a of the tines 12 and 13. As shown in FIG. 6, side surface electrodes 12e and 13e are formed on the side surfaces 12b and 13b of the tines 12 and 13. The inner and outer side surface electrodes 12e and 13e in the tines 12 and 13 are connected with each other by connecting electrodes 12e1 and 13e1 for connecting side surface electrodes. Reference characters 15a and 15b designate connecting electrodes for side surface electrode, and reference character 15c designates a groove/side surface connecting electrode. Reference numeral 16 designates a connecting electrode for groove electrode. Reference numeral 17 designates a thick film for frequency adjustment. The state of connection between these electrodes is the same as that of the tuning fork type crystal oscillator 20 according to the embodiment 1 explained with reference to FIG. 1A to FIG. 1C, and hence, the explanation thereof is omitted. Further, the fundamental principle for driving the tuning fork type crystal oscillator 30 according to the embodiment 2 in which these electrodes are used, is the same as that for driving the tuning fork type crystal oscillator 20 according to the embodiment 1, and hence, the explanation thereof is omitted here.

The features of the tuning fork type crystal oscillator 30 according to the embodiment 2 are as follows.

(1) The width of the grooves 12a and 13a is fixed through the whole length of the grooves, while tapered root regions are formed in the part close to the root of the tines 12 and 13, and the width of the tapered root regions is gradually increased toward the root. The width of the tines except the tapered root region is fixed. In the tapered root region of the tines, wiring regions D1 (FIG. 5B) with a sufficient width for forming the groove/side surface connecting electrode 15c (FIG. 5A) can be secured between the tine side surfaces 12b and 13b and the grooves 12a and 13a.

The width of this wiring region D1 is linearly changed from 0.03 mm to 0.02 mm in the region from the root of the tine to the position upper by 0.2 mm from the root, as described above. Here, even when the width of the groove/side surface connecting electrode 15c is set to a little less than 0.02 mm, a gap of about 0.01 mm (=0.03−0.02) can be secured between the groove/side surface connecting electrode 15c and the groove electrode 13d at the lower end of the wiring region D1. Even when the groove electrodes 13d are extended upwardly (in the Y axis direction) to some extent (for example, by 0.14 mm) from the lower end of the wiring region D1, a gap of at least a little less than 0.1 mm can be secured between the groove electrodes 13d and the groove/side surface connecting electrodes 15c. Thereby, the side surface electrode 13e and the groove/side surface connecting electrode 15c can be surely connected, without causing short circuit and disconnection.

Note that the side surface electrode 13e extends upwardly from a height position apart by at least 0.01 mm from the root of the tine, and is not present in the range from the root of the tine to the position upper by 0.01 mm from the root of the tine.

(2) As described above, in the region from the root of tines 12 and 13 to the position at the height of 0.2 mm, the distance from the side surfaces 12b and 13b of the tines to the grooves 12a and 13a changes gradually from 0.03 mm to 0.02 mm. Thus, in accordance with this change, the distance between the side surface electrodes 12e and 13e and the groove electrodes 12d and 13d also changes continuously.

Therefore, because of the same reason as in the case of the tuning fork type crystal oscillator 20 according to the embodiment 1 explained with reference to FIG. 1A and FIG. 1B, the average distance between the electrodes is shortened as compared with the conventional tuning fork type crystal oscillator having the stepped grooves. Thus, in the tuning fork type crystal oscillator 30 according to the embodiment 2, the series capacitance C1 of the equivalent circuit constants is increased in accordance with the principle as described above, as a result of which the CI value is reduced in accordance with the above formula (1).

(3) In the embodiment 2, the width of the grooves 12a and 13a (the dimension in the X axis direction) is fixed, as shown in FIG. 5B. Thus, when these grooves are formed by etching, the depth of the grooves (the position in the Z axis direction vertical to the X-axis and the Y-axis), is not formed into the stepped shape as in the case of the case of the conventional tuning fork type crystal oscillator having the stepped grooves, but is formed to be uniform, so that the variation in the dimension between the left groove 13a and the right groove 12a is reduced. Thereby, the rigidity between the left and right tines 13 and 12 is balanced, and the Q value is improved. As a result, the CI value is reduced in accordance with the above formula (1).

The invention claimed is:

1. A quartz piece which has a base and at least two tines extending from the base, wherein, for each tine,
    a groove is formed on at least one of the front surface and the rear surface of the tine along the lengthwise direction of the tine, and
    a gap from at least one side surface of the tine to the groove is gradually increased toward the base, with at least a part of the gap being gradually increased linearly.

2. The quartz piece according to claim 1, wherein the width of the tine is fixed through the whole length of the tine, while the width of the groove is gradually reduced toward the base, with at least a part of the width being gradually reduced linearly.

3. The quartz piece according to claim 1, wherein the width of the groove is fixed through the whole length of the groove, while the width of the tine is gradually increased toward the base, with at least a part of the width being gradually increased linearly.

4. An oscillator which has a base and at least two tines extending from the base, in which, for each tine,
    a groove is formed on at least one of the front surface and the rear surface of the tine along the lengthwise direction of the tine, a groove electrode is formed in the groove, and a side surface electrode is formed on a side surface of the tine,
    wherein the width of the tine is fixed through the whole length of the tine, while the width of the groove is gradually reduced toward the base, with at least a part of the width being gradually reduced linearly, so that an arrangement area of a connecting electrode is formed.

5. The oscillator according to claim 4, wherein the tine and the groove formed in the tine are formed symmetric with respect to the center line of the tine.

6. The oscillator according to claim 4, wherein the oscillator is formed with a tuning fork type crystal oscillating piece.

7. An oscillator which has a base and at least two tines extending from the base, in which, for each tine,
    a groove is formed on at least one of the front surface and the rear surface of the tine along the lengthwise direction of the tine, a groove electrode is formed in the groove, and a side surface electrode is formed on a side surface of the tine,
    wherein the width of the groove is fixed through the whole length of the groove, while the width of the tine is gradually increased toward the base, with at least a part of the width being gradually increased linearly.

8. The oscillator according to claim 7, wherein the tine and the groove formed in the tine are formed symmetric with respect to the center line of the tine.

9. The oscillator according to claim 7, wherein the oscillator is formed with a tuning fork type crystal oscillating piece.

10. An oscillator which has a base and at least two tines extended from the base, in which, for each tine,
    a groove is formed on at least one of the front surface and the rear surface of the tine along the lengthwise direction of the tine, a groove electrode is formed in the groove, and a side surface electrode is formed on a side surface of the tine,
    wherein the width of the tine is fixed through the whole length of the tine, while the width of the groove is gradually reduced toward the base, so that an arrangement area of a connecting electrode is formed,
    the width of the groove is linearly reduced,
    the tine and the groove are formed symmetric with respect to the center line of the tine, and
    the oscillator is formed with a tuning fork type crystal oscillating piece.

* * * * *